United States Patent
Tanaka et al.

(10) Patent No.: US 10,900,126 B2
(45) Date of Patent: Jan. 26, 2021

(54) SUBSTRATE TREATING METHOD AND APPARATUS USED THEREFOR

(71) Applicant: SCREEN Holdings Co., Ltd., Kyoto (JP)

(72) Inventors: Yuji Tanaka, Kyoto (JP); Chisayo Nakayama, Kyoto (JP); Masahiko Harumoto, Kyoto (JP); Masaya Asai, Kyoto (JP); Yasuhiro Fukumoto, Kyoto (JP); Tomohiro Matsuo, Kyoto (JP); Takeharu Ishii, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 15/854,010

(22) Filed: Dec. 26, 2017

(65) Prior Publication Data

US 2018/0230598 A1   Aug. 16, 2018

(30) Foreign Application Priority Data

Feb. 14, 2017   (JP) .................................. 2017-025226

(51) Int. Cl.
  *C23C 16/56*   (2006.01)
  *H01L 21/67*   (2006.01)
  (Continued)

(52) U.S. Cl.
  CPC ........ *C23C 16/56* (2013.01); *H01L 21/02337* (2013.01); *H01L 21/4871* (2013.01);
  (Continued)

(58) Field of Classification Search
  CPC ............... C23C 16/56; H01L 21/02337; H01L 21/4871; H01L 21/68742; H01L 21/6715;
  (Continued)

(56) References Cited

U.S. PATENT DOCUMENTS 6,015,503 A * 1/2000 Butterbaugh ......... B08B 7/0057
                                                134/1.3
6,403,924 B1 * 6/2002 Hayashi ............ H01L 21/67109
                                                219/390
(Continued)

FOREIGN PATENT DOCUMENTS

JP    2001-044117 A    2/2001
JP    2002-261087 A    9/2002
(Continued)

OTHER PUBLICATIONS

Office Action and Search Report dated Aug. 9, 2018 for corresponding Taiwan Patent Application No. 106145486.
(Continued)

*Primary Examiner* — Edward Chin
(74) *Attorney, Agent, or Firm* — Ostrolenk Faber LLP

(57) ABSTRACT

Disclosed is a substrate treating method for performing a heat treatment of a substrate in a heat treating space. The method includes a loading step of loading the substrate on support pins, an exhaust step of exhausting gas within the heat treating space, an inert gas supply step of supplying inert gas into the heat treating space, an under-substrate space gas discharging step of discharging gas within an under-substrate space between the substrate and the top face of the heat treating plate, and a heat treating step of retracting the support pins into the heat treating plate, and performing the heat treatment of the substrate placed on the top face of the heat treating plate in the heat treating space.

10 Claims, 4 Drawing Sheets

(51) Int. Cl.
*H01L 21/48* (2006.01)
*H01L 21/02* (2006.01)
*H01L 21/687* (2006.01)
*H01L 21/033* (2006.01)

(52) U.S. Cl.
CPC ...... *H01L 21/6715* (2013.01); *H01L 21/6719* (2013.01); *H01L 21/67098* (2013.01); *H01L 21/67103* (2013.01); *H01L 21/67109* (2013.01); *H01L 21/67126* (2013.01); *H01L 21/67178* (2013.01); *H01L 21/68742* (2013.01); *H01L 21/02318* (2013.01); *H01L 21/0337* (2013.01)

(58) Field of Classification Search
CPC ......... H01L 21/67098; H01L 21/67178; H01L 21/02318; H01L 21/0337; H01L 21/67017; H01L 21/324; H01L 21/6719
See application file for complete search history.

(56) References Cited

U.S. PATENT DOCUMENTS

| | | | | |
|---|---|---|---|---|
| 6,501,191 | B2* | 12/2002 | Tanaka | C30B 33/005 118/724 |
| 9,375,748 | B2* | 6/2016 | Harumoto | G03F 7/3021 |
| 2002/0117113 | A1 | 8/2002 | Tsuruno et al. | 118/715 |
| 2007/0075503 | A1* | 4/2007 | Hayashi | F16J 15/128 277/589 |
| 2010/0163403 | A1* | 7/2010 | Kitada | H01L 21/68742 204/164 |
| 2014/0022521 | A1 | 1/2014 | Harumoto et al. | 355/27 |
| 2015/0228512 | A1 | 8/2015 | Muramatsu et al. | |
| 2016/0163560 | A1 | 6/2016 | Esaki et al. | 438/759 |

FOREIGN PATENT DOCUMENTS

| | | |
|---|---|---|
| JP | 2004-336067 A | 11/2004 |
| JP | 2014-022570 A | 2/2014 |
| JP | 2014-087781 A | 5/2014 |
| TW | 201409536 A | 3/2014 |
| TW | 201631659 A | 9/2016 |

OTHER PUBLICATIONS

Office Action dated Aug. 19, 2019 for corresponding Korean Patent Application No. 10-2017-0180812.

Office Action and Search Report dated Nov. 4, 2020 for corresponding Japanese Patent Application No. 2017-025226.

* cited by examiner

SUBSTRATE TREATING METHOD AND APPARATUS USED THEREFOR

BACKGROUND OF THE INVENTION

(1) Field of the Invention

The present invention relates to a substrate treating method and an apparatus used therefor for performing a heat treatment of a semiconductor wafer, a substrate for liquid crystal display, a substrate for flat panel display (FPD) like a substrate for organic electroluminescence (EL), a substrate for optical display, a magnetic disk substrate, an optical magnetic disk substrate, a substrate for photomask, and a solar cell substrate (hereinafter, simply referred to as a substrate).

(2) Description of the Related Art

In recent process technologies, attention has been focused on a DSA process, for example, as a technology instead of immersion lithography or extreme ultraviolet (EUV) lithography. The DSA process is performed with a directed self-assembly (DSA) technology using micro phase separation of a block co-polymer for achieving much finer design rules on substrates.

In the currently-used substrate treating method in the DSA process, a block co-polymer (BCP) is applied to a substrate for deposition of a treated film, and thereafter, a heat treatment of heating the treated film on the substrate is performed in a heat treating space of a heat treating chamber, whereby (phase) separation of two types of polymers in the treated film is performed. Then, etching is performed to one of the (phase) separated polymers, whereby fine patterns are formed. See, for example, Japanese Unexamined Patent Publication No. 2014-22570A.

However, the example of the currently-used apparatus with such a configuration has the following problems.

Specifically, in the currently-used method, such a problem may arise as the polymer in the treated film is not able to be separated appropriately depending on a treatment atmosphere in the heat treating space. Moreover, the deposited film may pose some difficulty in its property and performance depending on a treatment atmosphere in the heat treating space also during a process of performing heat treatment of the substrate within the heat treating chamber other than the DSA process, the process including process of depositing a film by a heat treatment after a spin on glass (SOG) solution is applied to the substrate.

SUMMARY OF THE INVENTION

The present invention has been made regarding the state of the art noted above, and its one object is to provide a substrate treating method and an apparatus used therefor that allow appropriate film deposition by producing a suitable treatment atmosphere in a heat treating space in a heat treating process.

To fulfill the above object, Inventors of the present invention have made intensive research and attained the following findings.

Attention was focused on an influence of oxygen in a heat treating space in view of a relationship between various parameters of the heat treating space and a separated condition of a polymer after a heat treatment under different treatment atmospheres in the heat treating space of the heat treating chamber. Such attention was made based on the finding that inappropriate phase separation of the polymers was performed during the heat treatment where an oxygen concentration in the heat treating space was lowered incompletely. Now, it is estimated that, if the oxygen concentration is lowered incompletely, the polymer is adversely affected during phase separation thereof, and accordingly normal phase separation is inhibited. Also in heat treatment processes other than the DSA process, oxidation caused by oxygen adversely affects a property of film deposition. Then, the Inventors has found the feature that the oxygen concentration in the heat treating space increases temporarily when the substrate is placed on the heat treating plate for start of the heat treatment of the substrate after the oxygen concentration in the heat treating space decreases. The present invention based on such finding as above is constituted as under.

In order to accomplish the above object, the present invention adopts the following construction.

One aspect of the present invention provides a substrate treating method for performing a heat treatment of a substrate having a treated film formed thereon in a heat treating space of a heat treating chamber. The method includes a loading step of loading the substrate on support pins projecting from a top face of a heat treating plate; an exhaust step of exhausting gas within the heat treating space; an inert gas supply step of supplying inert gas into the heat treating space; an under-substrate space gas discharging step of discharging gas within an under-substrate space between the substrate and the top face of the heat treating plate; and a heat treating step of retracting the support pins into the heat treating plate, and performing the heat treatment of the substrate placed on the top face of the heat treating plate in the heat treating space.

With the aspect of the present invention, the loading step is performed, and thereafter, the exhaust step and the inert gas supply step are performed. Since the under-substrate space is a narrow space between a rear face of the substrate and the top face of the heat treating plate, oxygen within the under-substrate space is hard to be replaced. Then, the under-substrate space gas discharging step is performed to discharge the gas within the under-substrate space, and then the heat treating step is performed. Consequently, oxygen stagnated in the under-substrate space is able to be replaced by the inert gas, achieving an extremely lowered oxygen concentration in the heat treating space. As a result, the treatment atmosphere within the heat treating space during the heat treating step is able to be made suitable for the heat treating process, leading to appropriate film deposition.

It is also preferred in the under-substrate space gas discharging step of the present invention that inert gas is supplied into the under-substrate space.

Supplying the inert gas allows expelling of the oxygen stagnated in the under-substrate space.

It is also preferred in the under-substrate space gas discharging step of the present invention that the gas within the under-substrate space is discharged from the top face of the heat treating plate.

Discharging the gas within the under-substrate space allows expelling of the oxygen stagnated in the under-substrate space.

It is also preferred in the present invention that the under-substrate space gas discharging step stops before the substrate is placed on the top face of the heat treating plate in the heat treating step.

Since the under-substrate space gas discharging step stops before the substrate is placed on the heat treating plate, the substrate is placeable on the heat treating plate in a stable manner.

It is preferred in the aspect of the present invention that the treated film is made from a directed self-assembly material.

This makes the treatment atmosphere in the heat treating space suitable for the DSA process, achieving appropriate (phase) separation of the polymer.

Another aspect of the present invention provides a substrate treating apparatus for performing a heat treatment of a substrate having a treated film formed thereon in a heat treating space. The apparatus includes a heat treating plate that is isolated from an ambient atmosphere by a cover and forms the heat treating space within the cover; support pins that move between a delivery position of the substrate where the support pins project from a top face of the heat treating plate and a retracted position where the support pins are retracted in the heat treating plate for placing the held substrate on the top face of the heat treating plate; an inert gas supplying device that supplies inert gas into the cover; an exhaust device that exhausts gas within the cover; and an under-substrate space gas discharging device that discharges gas within an under-substrate space between the substrate held with the support pins and the top face of the heat treating plate. The heat treatment of the substrate is performed by supporting the substrate with the support pins in the delivery position, exhausting the gas within the heat treating space by the exhaust device while supplying the inert gas by the inert gas supplying device, discharging the gas within the under-substrate space by the under-substrate space gas discharging device, and moving the support pins to the retracted position to place the substrate on the top face of the heat treating plate.

With the aspect of the present invention, the gas is exhausted and the inert gas is supplied after the support pins support the substrate in the delivery position. Since the under-substrate space is a narrow space between the rear face of the substrate and the top face of the heat treating plate, oxygen within the under-substrate space is hard to be replaced. Accordingly, the under-substrate space gas discharging device discharges the gas within the under-substrate space, and thereafter the heat treatment is performed. Consequently, the oxygen stagnated in the under-substrate space is able to be replaced by the inert gas, achieving an extremely lowered oxygen concentration within the heat treating space. As a result, the treatment atmosphere within the heat treating space during the heat treatment is able to be made suitable for the heat treating process, leading to appropriate film deposition.

It is preferred in the aspect of the present invention that the under-substrate space gas discharging device supplies the inert gas toward the under-substrate space from a topside plate opening that is opened in the top face of the heat treating plate.

Supplying the inert gas from the topside plate opening allows expelling of the oxygen stagnated in the under-substrate space.

It is preferred in the aspect of the present invention that the under-substrate space gas discharging device discharges the gas within the under-substrate space from a topside plate opening that is opened in the top face of the heat treating plate.

Discharging the gas within the under-substrate space from the topside plate opening allows expelling of oxygen stagnated in the under-substrate space.

Moreover, it is preferred in the aspect of the present invention that the under-substrate space gas discharging device stops before the support pins move to the retracted position.

Since the under-substrate space gas discharging device stops before the substrate is placed on the top face of the heat treating plate, the substrate is able to be placed on the heat treating plate in a stable manner.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
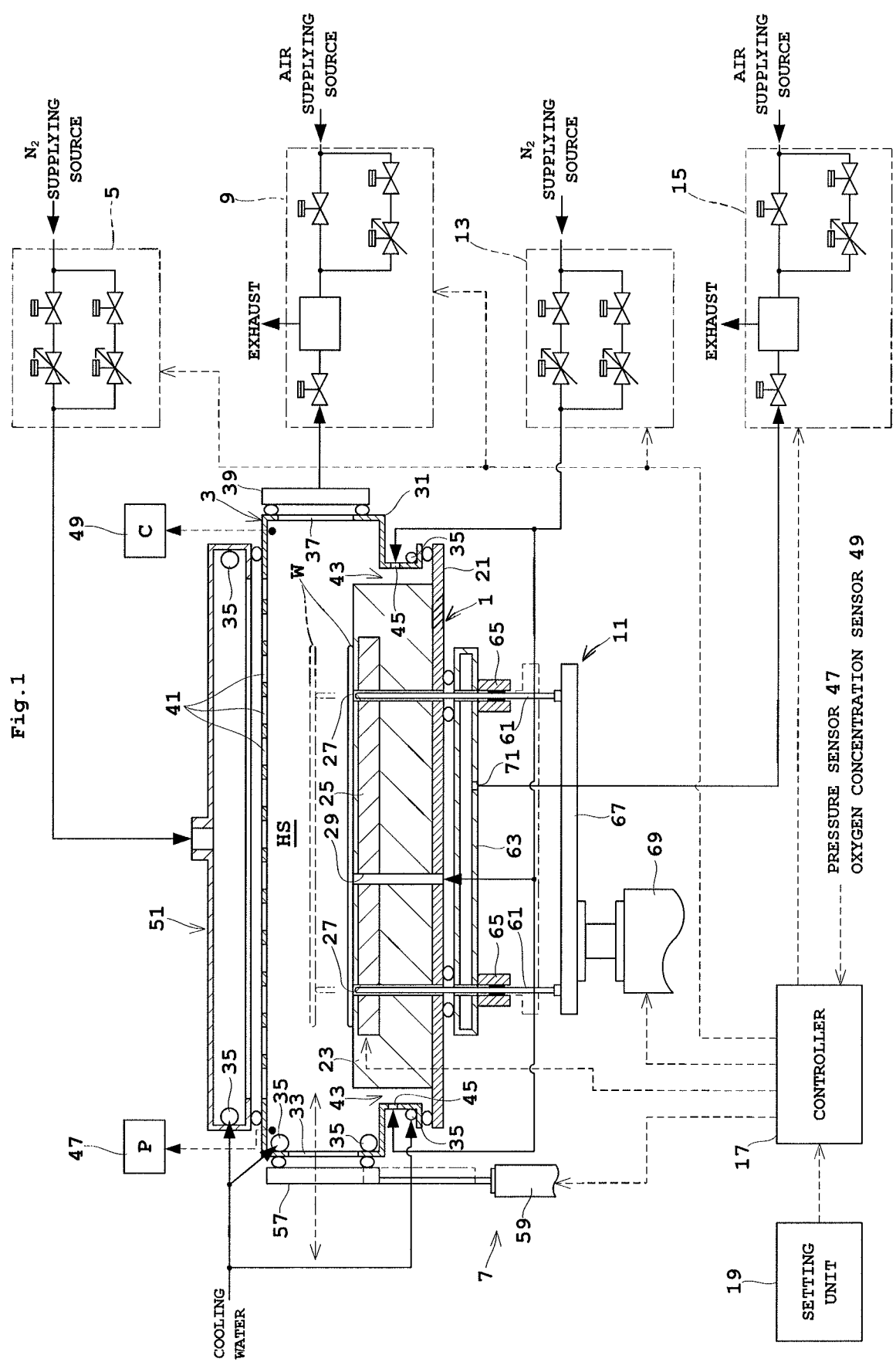
FIG. 1 schematically illustrates an overall configuration of a substrate treating apparatus according to one embodiment of the present invention.

The following describes one embodiment of the present invention with reference to drawings. FIG. 1 schematically illustrates an overall configuration of a substrate treating apparatus according to one embodiment of the present invention.

The substrate treating apparatus according to the present embodiment for executing a substrate treating method is used for performing a heat treatment of a substrate W. Examples of the substrate W in the present embodiment include one having a treated film made from a directed self-assembly material deposited on a front face thereof.

The substrate treating apparatus according to the present embodiment includes a heat treatment plate unit 1, a heat treating chamber 3, an upper gas supply unit 5, a shutter 7, a chamber exhaust unit 9, a support pin lifting member 11, a lower gas supply unit 13, a support pin seal exhaust unit 15, a controller 17, and a setting unit 19.

The heat treatment plate unit 1 places the substrate W on its top face for performing a heat treatment of the substrate W. The heat treatment plate unit 1 includes a base plate 21, a heat treating plate 23, and a heater 25. The base plate 21 is attached to a lower part of the heat treating plate 23, and is also attached to a lower part of the heat treating chamber 3 together with the heat treating plate 23. The heat treating plate 23 is composed of a material whose base material is a metal, such as copper (Cu) and aluminum (Al), with a high thermal conductivity. The heater 25 is embedded in the heat treating plate 23, and controls a temperature of the heat treating plate 23. For instance, the heater 25 controls a temperature of the heat treating plate 23 within a range of 300 to 400° C. The heat treating plate 23 has proximity balls, not shown, embedded in its top face for locating a rear face of the substrate W away from a top face of the heat treating plate 23 by a given interval (e.g., 0.1 mm).

The heat treating plate 23 has through holes 27 formed at positions corresponding to vertexes of a regular triangle in plan view. The through holes 27 each pass from the top face to the rear face of the heat treating plate 23, and also pass through the base plate 21. Holder pins mentioned later are inserted into the through holes 27, respectively. Moreover, a topside plate supply port 29 passing the heat treating plate 23 and the base plate 21 in a vertical direction is formed around the center of the heat treating plate 23.

Here, the topside plate supply port 29 corresponds to the "topside plate opening" and the "under-substrate space gas discharging device" in claim 7 of the present invention.

The heat treating chamber 3 includes a cover 31. The cover 31 includes an opening at a lower portion thereof, and the heat treatment plate unit 1 is attached to the opening. The cover 31 shows a shape that covers a lateral side and an upper side of the heat treatment plate unit 1. A space is formed between the ceiling of the cover 31 and the top face of the heat treating plate 23. The space corresponds to a heat treating space HS. The cover 31 has a load outlet 33 formed on a first side face thereof. The load outlet 33 is used for loading a substrate W to be treated into the heat treating space HS and unloading the treated substrate W from the heat treating space HS. A cooling pipe 35 is attached around the load outlet 33. The cooling pipe 35 cools the cover 31 with cooling water supplied thereto, and protects an O-ring around the load outlet 33.

The cover 31 has an exhaust port 37 formed on a second side face thereof, which is opposite to the load outlet 33. The exhaust port 37 is used for exhausting gas within the cover 31. The exhaust port 37 has a flow path sectional area corresponding to a vertical sectional area of the heat treating space HS. An exhaust port cover 39 is removably attached to the outside of the exhaust port 37 via the O-ring. The ceiling of the cover 31 includes a plurality of through holes 41. An annular gap 43 in plan view is present between the heat treatment plate unit 1 and an outer peripheral surface of the heat treatment plate 23 of the cover 31 around the heat treatment plate unit 1. A side face of the cover 31 facing to the gap 43 has openings 45 each in communication with the gap 43. The openings 45 are, for example, formed at two positions facing to each other in plan view. The cooling pipe 35 is disposed at an outer face of the cover 31 below the openings 45. The cooling pipe 35 protects the O-ring between the cover 31 and the base plate 21. The lower gas supply unit 13 supplies nitrogen gas to the openings 45 and the topside plate supply port 29. The lower gas supply unit 13 includes a plurality of flow rate regulating valves or on-off valves for allowing regulation of a flow rate of the nitrogen gas.

The exhaust port 37 exhausts gas through the exhaust port having the flow path sectional area corresponding to the vertical sectional area of the heat treating space HS, leading to efficient exhaust.

A pressure sensor 47 is disposed above the cover 31 adjacent to the load outlet 33. An oxygen concentration sensor 49 is disposed above the cover 31 adjacent to the exhaust port 37. The pressure sensor 47 determines pressure within the heat treating space HS. The oxygen concentration sensor 49 determines an oxygen concentration within the heat treating space HS. As is described hereunder, it should be noted that the oxygen concentration sensor 49 is only used when an examination to determine lapsed time during which the oxygen concentration is lowered to a target value or less, and accordingly, the oxygen concentration sensor 49 is not necessarily provided during normal treatment.

A gas supply buffer 51 is disposed above the cover 31. Here, nitrogen ($N_2$) gas supplied from the center of the top face of the cover 31 is supplied from an underside opening of the cover 31, having a larger area than the center of the top face, through a plurality of through holes 41 into the heat treating space HS. An O-ring is disposed between the top face of the cover 31 and an under face of the gas supply buffer 51. Another cooling pipe 35 is disposed inside of the gas supply buffer 51. The cooling pipe 35 protects the O-ring. The upper gas supply unit 5 supplies nitrogen gas as inert gas to the gas supply buffer 51 mentioned above. The upper gas supply unit 5 includes two flow rate regulating valves, for example, that allow switch of a flow rate of the nitrogen gas in two steps.

Here, the openings 45 and the gas supply buffer 51 correspond to the "inert gas supplying device" in the present invention.

The shutter 7 is disposed on a front face of the load outlet 33. The shutter 7 includes the load outlet 33, a shutter body 57, and an actuator 59. The shutter body 57 is lifted by the actuator 59 whose actuating pieces move upwardly/downwardly in a vertical direction. The shutter body 57 closes the load outlet 33 via the O-ring when moving upwardly. When the actuator 59 is brought into an actuated state, the shutter body 57 moves to a position denoted by solid lines in FIG. 1 to close the load outlet 33. When the actuator 59 is brought into a non-actuated state, the shutter body 57 moves downwardly to a position denoted by chain double-dashed lines in FIG. 1 to open the load outlet 33.

The chamber exhaust unit 9 exhausts gas within the heat treating space HS via the exhaust port cover 39 mentioned above. The chamber exhaust unit 9 includes a plurality of on-off valves, flow rate regulating valves, aspirators, and the like, for exhausting the gas within the heat treating space HS by supplying air from an air supplying source. It should be noted that the chamber exhaust unit 9 may be formed by an exhaust pump and the like instead of the aspirators and the air supplying source.

The support pin lifting member 11 includes three support pins 61 (two of which are only denoted in FIG. 1 for an illustrational reason), a manifold 63, mechanical seals 65, a lifting member 67, and an actuator 69. The support pins 61 are inserted into the through holes 27, respectively. The support pins 61 pass through the manifold 63 and are coupled at lower ends thereof to the lifting member 67 via the mechanical seals 65. An O-ring is attached between the top face of the manifold 63 and the base plate 21 so as to surround each of the through holes 27. Upper ends of the mechanical seals 65 are attached to an under face of the manifold 63. The mechanical seals 65 are metal seals that allow upward/downward movement of the support pins 61 while supporting outer peripheral surfaces of the support pins 61 in a sealing manner. The manifold 63 shows a triangle shape in plan view, and has one space formed therein. The manifold 63 has an exhaust port 71 formed at one region thereof in communication with the space.

The lifting member 67 shows an annular shape in plan view, and is moved upwardly/downwardly by the actuator 69. The actuator 69 is disposed in an attitude where the actuating pieces are moved forward/backward in the vertical direction. When the actuator 69 is brought into an actuated state, the support pins 61 project to move to the delivery position denoted by chain double-dashed lines in FIG. 1. When the actuator 69 is brought into a non-actuated state, the support pins 61 moves to the retracted position denoted by solid lines in FIG. 1. When the support pins 61 move to the retraced position, the substrate W is placed on the top face of the heat treating plate 23.

The support pin seal exhaust unit 15 exhausts gas from an exhaust port 71 of the manifold 63. The support pin seal exhaust unit 15 includes a plurality of on-off valves, flow rate regulating valves, aspirators, and the like for exhausting gas within the heat treating space HS through the manifold 63 and the through holes 27 by supplying air from an air supplying source. In addition, dust generated on the mechanical seals 65 is discharged simultaneously. It should be noted that the support pin seal exhaust unit 15 may be formed by a vacuum pump instead of the aspirators and the air supplying source.

The support pin seal exhaust unit 15 exhausts gas from the through holes 27 that are formed near a position where the substrate W is placed during the heat treatment. This achieves effective reduction in oxygen concentration around the substrate W that may influence film deposition largely during the heat treatment. Moreover, since the dust generated due to slide of the support pins 61 on the mechanical seals 65 is discharged without entering into the heat treating space HS, the substrate W is able to be treated cleanly.

Here, the exhaust ports 37 and 71 correspond to the "exhaust device" in the present invention.

The upper gas supply unit 5, the chamber exhaust unit 9, the lower gas supply unit 13, the support pin seal exhaust unit 15, and the actuators 59, 69 are controlled en bloc by a controller 17. The controller 17 contains a CPU, a memory, and a timer, each of which is not shown. The controller 17 causes the memory, not shown, to store in advance a plurality of recipes that specific procedures of the heat treatment. The setting unit 19 is operated by an operator to select one of the recipes and to provide an instruction for starting treatment or for operation when an alarm is given.

In the present embodiment, the memory not shown stores in advance a chamber exhaust time, a heat treatment shifting time, a heat treating time, a cooling time, and the like, and such time is referred to by the controller 17 as appropriately. The heat treatment shifting time is lapsed time from an exhaust starting time when the oxygen concentration within the heat treating space HS is lowered to the target value or less in the heat treatment, which is to be mentioned later. This time is measured and determined in advance through examinations while the oxygen concentration sensor 49 is provided.

Figure 2:
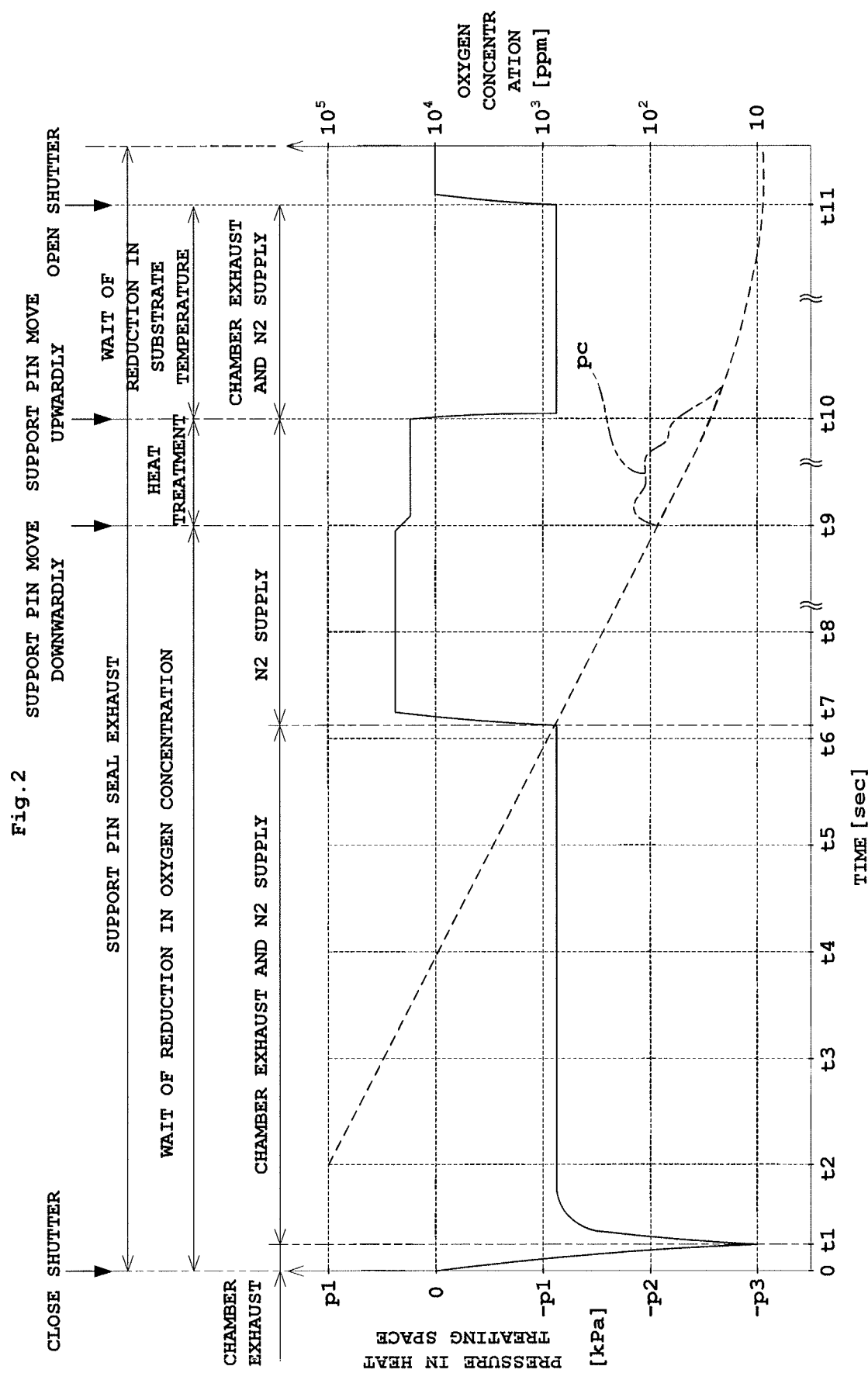
FIG. 2 is a time chart illustrating one example of treating a substrate according to the embodiment.
Figure 3:
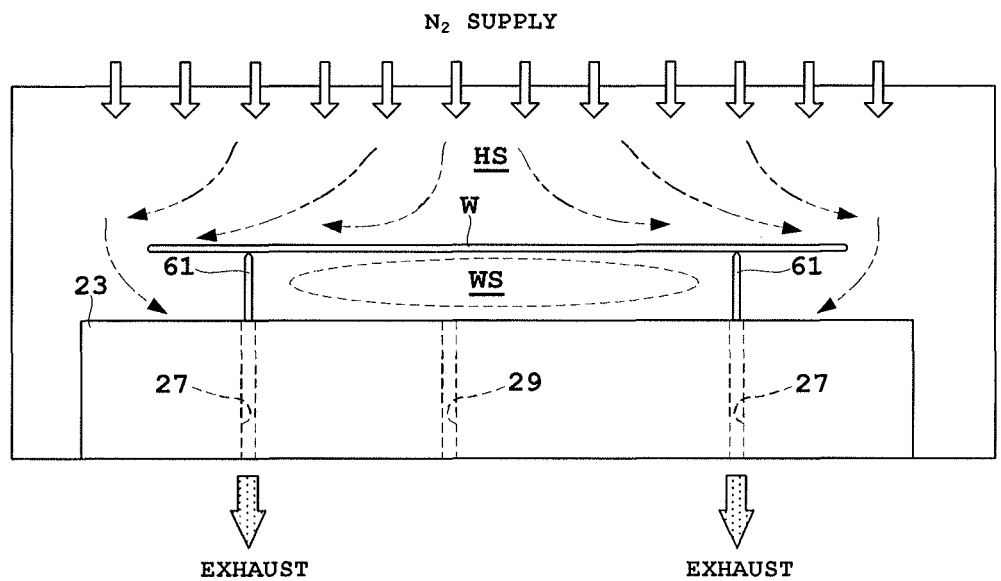
FIG. 3 schematically illustrates gas flow during gas exhaust and supply of inert gas.
Figure 4:
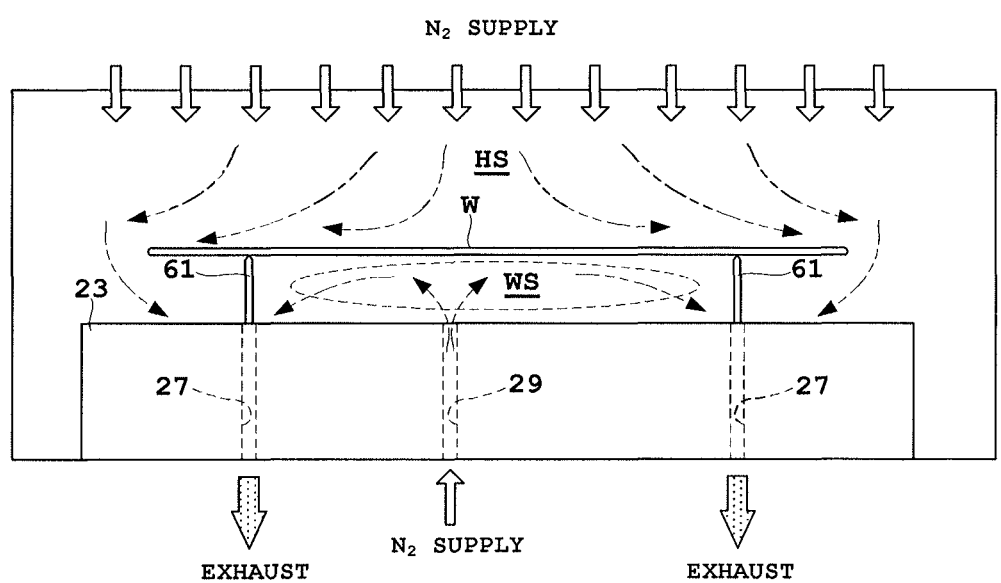
FIG. 4 schematically illustrates gas flow during gas exhaust, supply of inert gas, and gas exhaust within an under-substrate space.

The following describes one example of the heat treatment by the substrate treating apparatus mentioned above with reference to FIGS. 2 to 4. It should be noted that FIG. 2 is a time chart illustrating one example of treating the substrate according to the present embodiment, FIG. 3 schematically illustrates gas flow during gas exhaust and supply of inert gas, and FIG. 4 schematically illustrates gas flow during gas exhaust and supply of inert gas as well as during removal of gas in the under-substrate space. Here, pressure within the heat treating space HS is denoted by solid lines, and an oxygen concentration in the heat treating space HS is denoted by dotted lines in the time chart of FIG. 2.

Moreover, the substrate W to be treated is loaded into the heat treating space HS by a transport mechanism, not shown, and is held with the support pin 61 in the delivery position at a position away from the front face of the heat treating plate 23 as in FIG. 3, which corresponds to the "loading step" in the present invention. At this time, a gap between the lower face of the substrate W and the top face of the heat treating plate 23 is narrow, and is approximately 20 mm.

Here, a space between the lower face of the substrate W and the top face of the heat treating plate 23 is referred to as an "under-substrate space WS".

At time 0, the controller 17 causes the support pin seal exhaust unit 15 to start exhaust from the exhaust port 71, and causes the chamber exhaust unit 9 to start exhaust from the exhaust port 37. Accordingly, gas within the heat treating space HS starts to be exhausted, and pressure is sharply decreased to −p3 kPa at time t1 as the chamber exhaust time. It should be noted that the condition to make the pressure decreased to −p3 kPa at the time t1 as the chamber exhaust time is determined in advance through various examinations of adjusting an exhaust amount from the chamber exhaust unit 9 and the support pin seal exhaust unit 15. Simultaneously, the controller 17 also starts clocking. Such sharp exhaust produces the effect of preventing air from entering from the outside into the heat treating space HS by causing the shutter body 57 to adhere to the O-ring of the load outlet 33 tightly.

After clocking the time t1 as the chamber exhaust time, the controller 17 causes the upper gas supply unit 5 and the lower gas supply unit 13 to start supply of nitrogen gas. Accordingly, pressure within the heat treating space HS moves back sharply to the atmospheric pressure while negative pressure of around −p1 kPa is maintained. This is achieved by making the supply amount of nitrogen gas from the upper gas supply unit 5 and the lower gas supply unit 13 less than the exhaust amount from the chamber exhaust unit 9 and the support pin seal exhaust unit 15. During a period of the time t1 to time t7, the oxygen concentration is lowered through the exhaust and the supply of the nitrogen gas.

During the period of the time t1 to the time t7, the negative pressure is maintained with the exhaust amount larger than the supply amount of the nitrogen gas. The oxygen stagnated at corners within the heat treating chamber 3 and the like is discharged by flow of the nitrogen gas more easily than by flow of the exhaust. Accordingly, this achieves more reduction in oxygen concentration.

The controller 17 causes the chamber exhaust unit 9 to stop at the time t7 corresponding to time after a given period of time from the time 0, and the processing is shifted to exhaust via the through holes 27 (support pin seal exhaust) and reduction in oxygen concentration by purge of supplying nitrogen gas from the upper gas supply unit 5 and the lower gas supply unit 13. This reduces a flow rate of exhaust, leading to variation in pressure of the heat treating space HS toward the atmospheric pressure to maintain the pressurized space.

At this time, when no nitrogen gas is supplied from the topside plate opening 29, gas may possibly be stagnated in the narrowed under-substrate space WS as in FIG. 3. The Inventors have already confirmed the phenomenon that the oxygen concentration in the heat treating space HS is increases due to the gas pushed upwardly on the lower face of the substrate W when the support pins 61 move downwardly while no nitrogen gas is supplied from the topside plate supply port 29. For instance, in such a case, the oxygen concentration is increased over the target value as the numeral pc denoted by chain double-dashed lines during a period of time t9 to time t10 in FIG. 2. Then, nitrogen gas is supplied from the lower gas supply unit 13, whereby the gas within the under-substrate space WS is able to be discharged from the through holes 27 along with the flow of nitrogen gas as illustrated in FIG. 4. Moreover, oxygen may possibly be stagnated in the gap 43 around the heat treating plate 23. Then, supplying nitrogen gas from the opening 45 leads to exhaust of the oxygen. Consequently, an extremely lowered oxygen concentration is obtainable in the heat treating space HS.

When the clocking time has reached the heat treatment shifting time set in advance, the controller 17 causes the support pins 61 to move downwardly to shift the processing to the heat treatment. During the period of time t7 to time t9, chamber exhaust is stopped and exhaust via the through holes 27 (support pin seal exhaust) and supply of the nitrogen gas are performed, leading to flow variation within the heat treating space HS until the time t7. Accordingly, discharge of the oxygen stagnated in the heat treating space HS is obtainable along with the flow variation, achieving a more lowered oxygen concentration.

Here, the period of the time t1 to the time t9 mentioned above corresponds to the "exhaust step", the "inert gas supply step", and the "under-substrate space gas discharging step" in the present invention.

When the time has reached the heat treatment shifting time, the controller 17 causes the actuator 69 to be brought into a non-actuated state, and causes the support pins 61 to move downwardly to the retracted position. Accordingly, the substrate W is placed on the top face of the heat treating plate 23, and the heat treatment of the substrate W is started. The controller 17 starts clocking and maintains this condition until time t10 at which the time reaches the heat treating time. Here, in the time t9, the oxygen concentration in the heat treating space HS is lowered to 100 ppm or less as the target value.

As noted above, the process is able to be shifted to the heat treatment by merely measuring the heat treating time without using any oxygen concentration meter 49. This achieves the simplified configuration of the substrate treating apparatus, leading to reduction in cost needed for the processing.

When the clocking time has reached the heat treating time, the controller 17 causes the actuator 69 to actuate at the time t10 to move the support pins 61 upwardly. Accordingly, the substrate W is moved away from the heat treating plate 23 to the delivery position. The controller 17 causes the chamber exhaust unit 9 to actuate to start exhaust from the exhaust port 37, and to start clocking. This causes cooling of the substrate W.

The period of time t9 to t10 corresponds to the "heat treating step" in the present invention.

When the clocking time reaches the cooling time, the controller 17 causes the chamber exhaust unit 9, the upper gas supply unit 5, and the lower gas supply unit 13 at the time t11 to stop. Then, the actuator 59 is brought into a non-actuation condition, and the shutter body 57 is moved downwardly for unloading the substrate W.

With the present embodiment, the gas is exhausted and the inert gas is supplied after the substrate W id loaded. Since the under-substrate space WS is a narrow space between the undersurface of the substrate W and the front face of the heat treating plate 23, oxygen within the under-substrate space WAS is hard to be replaced. Accordingly, nitrogen gas is supplied into the under-substrate space WS for discharging the gas within the under-substrate space WS, and thereafter the heat treatment is performed during the period of time t9 to t10. Consequently, the oxygen stagnated in the under-substrate space WS is able to be replaced by the inert gas, achieving an extremely lowered oxygen concentration within the heat treating space HS. As a result, the treatment atmosphere within the heat treating space HS during the heat treatment is able to be made suitable for the heat treating process, leading to appropriate film deposition.

MODIFICATION

Figure 5:
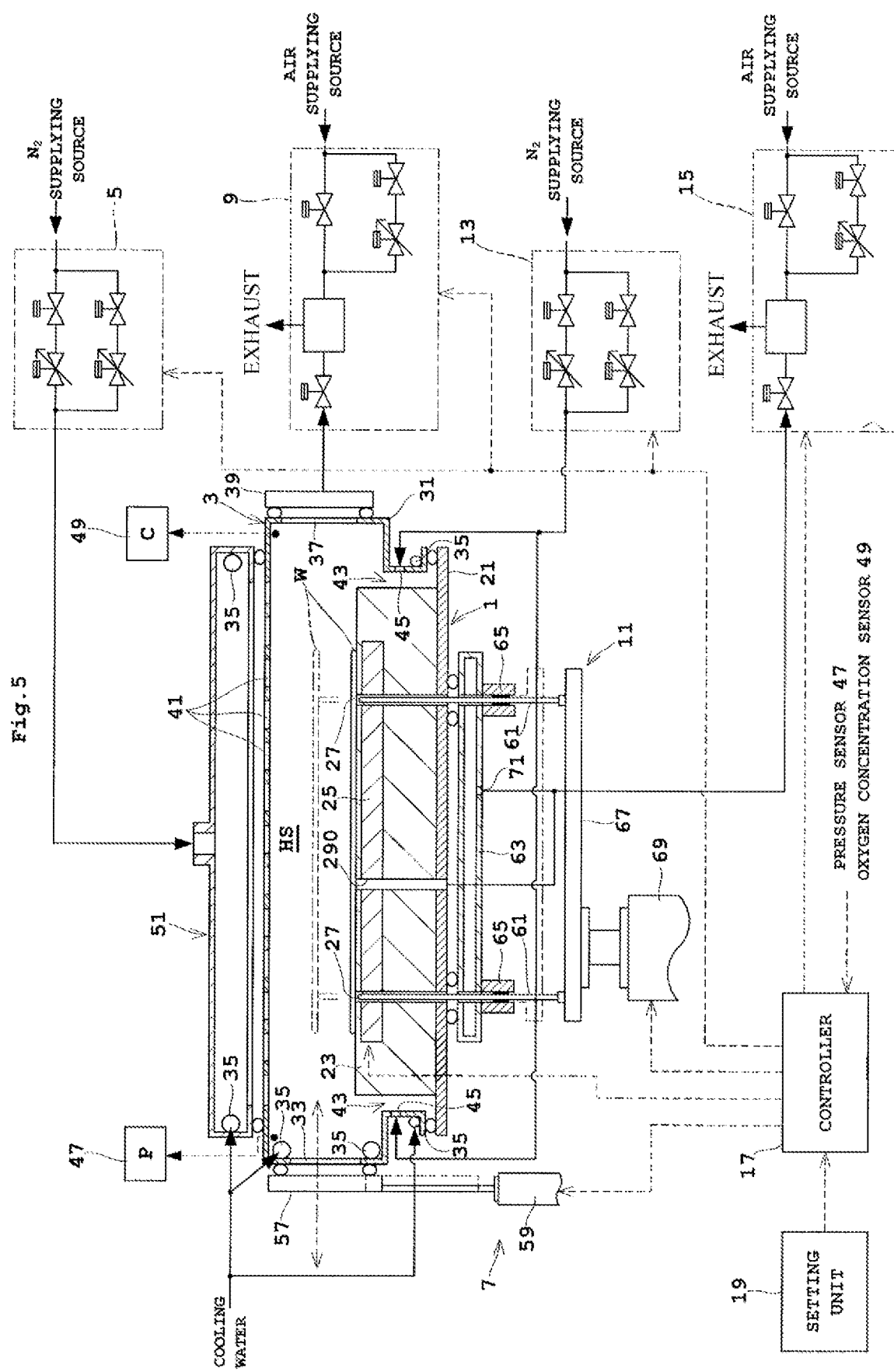
FIG. 5 schematically illustrates an overall configuration of a substrate treating apparatus according to one modification of the present invention.

The following describes one modification of the present invention with reference to FIG. 5. FIG. 5 schematically illustrates an overall configuration of a substrate treating apparatus according to the modification.

In the embodiment mentioned above, nitrogen gas is supplied from the topside plate supply port 29. In contrast to this, in the modification, a plate top face exhaust port 290 is in communication with the support pin seal exhaust unit 15. Even with such a configuration made for gas exhaust from the plate top face exhaust port 290 during the period of time t1 t10, gas within the under-substrate space WS is able to be discharged from the through holes 27. Consequently, the modification is able to produce the effect similar to that of the embodiment mentioned above.

In such a case, the plate top face exhaust port 290 corresponds to the "topside plate opening" and the "under-substrate space gas discharging device" in claim 8 of the present invention.

The present invention is not limited to the foregoing examples, but may be modified as follows.

(1) In the embodiment mentioned above, the substrate W has a treated film coated thereon that is made from a directed self-assembly material. Such a substrate W is not limitative in the present invention. For instance, the present invention is applicable to the treatment that the oxygen concentration in the heat treating space HS adversely affects, such as treatment for a substrate to which a spin on glass (SOG) solution is applied.

(2) In the embodiment mentioned above, the nitrogen gas is continuously supplied from the topside plate supply port 29 after the heat treatment starts. However, the supply may stop before the substrate W is moved downwardly to a treatment position. This avoids inconvenience that the substrate W is placed in an unstable and thus is not placed stably in the treatment position depending on the supply amount.

(3) In the modification mentioned above, the gas exhaust is performed from the plate top face exhaust port 290 also after the heat treatment starts. However, the gas exhaust may stop before the substrate W is moved downwardly to the treatment position. This avoids inconvenience that the substrate W is placed in an unstable and thus is not placed stably in the treatment position depending on the supply amount.

(4) In the embodiment mentioned above, nitrogen gas has been described as one example of the inert gas. However, another type of inert gas such as argon or helium may be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for performing a heat treatment of a substrate having a treated film formed thereon in a heat treating space of a heat treating chamber, the method comprising:
   a loading step of loading the substrate on support pins projecting from a top face of a heat treating plate;
   an exhaust step of exhausting gas within the heat treating space;
   an inert gas supply step of supplying inert gas into the heat treating space;
   an under-substrate space gas discharging step of discharging gas within an under-substrate space between the substrate and the top face of the heat treating plate; and a heat treating step of retracting the support pins into the heat treating plate, and performing the heat treatment of the substrate placed on the top face of the heat treating plate in the heat treating space, wherein in the under-substrate space gas discharging step, gas is supplied from the top face of the heat treating plate at a center of the substrate in plan view to the under-substrate space, and gas within the under-substrate space is discharged from the top face of the heat treating plate in the under-substrate space through a plurality of through-holes in the heat treating plate which accommodate the support pins.

2. The substrate treating method according to claim 1, wherein in the under-substrate space gas discharging step, inert gas is supplied into the under-substrate space.

3. The substrate treating method according to claim 1, wherein the under-substrate space gas discharging step stops before the substrate is placed on the top face of the heat treating plate in the heat treating step.

4. The substrate treating method according to claim 2, wherein the under-substrate space gas discharging step stops before the substrate is placed on the top face of the heat treating plate in the heat treating step.

5. The substrate treating method according to claim 1, wherein the treated film is made from a directed self-assembly material.

6. The substrate treating method according to claim 2, wherein the treated film is made from a directed self-assembly material.

7. The substrate treating method according to claim 3, wherein the treated film is made from a directed self-assembly material.

8. The substrate treating method according to claim 4, wherein the treated film is made from a directed self-assembly material.

9. The substrate treating method according to claim 1, wherein the plurality of through-holes are disposed in the heat treating plate at positions spaced away from the center of the heat treating plate.

10. The substrate treating method according to claim 9, wherein the plurality of through-holes are disposed symmetrically about the center of the heat treating plate.

* * * * *